(12) United States Patent
Shibata et al.

(10) Patent No.: US 6,749,957 B2
(45) Date of Patent: Jun. 15, 2004

(54) METHOD FOR FABRICATING A III NITRIDE FILM, SUBSTRATE FOR EPITAXIAL GROWTH, III NITRIDE FILM, EPITAXIAL GROWTH SUBSTRATE FOR III NITRIDE ELEMENT AND III NITRIDE ELEMENT

(75) Inventors: Tomohiko Shibata, Kasugai (JP); Shigeaki Sumiya, Hekinan (JP); Mitsuhiro Tanaka, Handa (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 10/321,658

(22) Filed: Dec. 18, 2002

(65) Prior Publication Data
US 2003/0124393 A1 Jul. 3, 2003

(30) Foreign Application Priority Data

Dec. 25, 2001 (JP) .......................... 2001-390844
Mar. 22, 2002 (JP) .......................... 2002-080745
Sep. 3, 2002 (JP) .......................... 2002-257864

(51) Int. Cl.$^7$ .............................. B32B 9/04; C30B 29/38

(52) U.S. Cl. ........................ 428/698; 428/336; 428/697; 117/88; 117/89; 117/105; 117/952

(58) Field of Search ................................ 428/698, 697, 428/336; 117/88, 89, 105, 952

(56) References Cited

U.S. PATENT DOCUMENTS

| | | | | |
|---|---|---|---|---|
| 5,549,951 A | * | 8/1996 | Yamaguchi et al. | 428/565 |
| 6,508,878 B2 | * | 1/2003 | Kim et al. | 117/89 |
| 2002/0061655 A1 | * | 5/2002 | Shibata et al. | 438/730 |
| 2002/0155649 A1 | * | 10/2002 | Shibata et al. | 438/200 |
| 2002/0190275 A1 | * | 12/2002 | Shibata et al. | 257/200 |

FOREIGN PATENT DOCUMENTS

| | | | |
|---|---|---|---|
| JP | 07138086 A | * | 5/1995 |
| JP | A-2002-367917 | | 12/2002 |

* cited by examiner

Primary Examiner—Stephen Stein
(74) Attorney, Agent, or Firm—Oliff & Berridge, PLC

(57) ABSTRACT

An acicular structure is formed of AlN on the main surface of a base made of single crystal. Then, a desired Al-including III nitride film is formed on the main surface of the base via the acicular structure.

16 Claims, 6 Drawing Sheets

METHOD FOR FABRICATING A III NITRIDE FILM, SUBSTRATE FOR EPITAXIAL GROWTH, III NITRIDE FILM, EPITAXIAL GROWTH SUBSTRATE FOR III NITRIDE ELEMENT AND III NITRIDE ELEMENT

BACKGROUND OF THE INVENTION

1. Field of the Invention

This invention relates to a method for fabricating a III nitride film, a substrate for epitaxial growth and a III nitride film, particularly usable for fabricating a semiconductor film constituting a semiconductor element, a substrate for the semiconductor element and the semiconductor film of the semiconductor element. Also, this invention relates to an epitaxial substrate for semiconductor element and a III nitride element.

2. Related Art Statement

III nitride films are used as semiconductor films for light-emitting diodes and electronic devices, and recently get attention as semiconductor films for high speed IC chips. Particularly, Al-including III nitride films get attention as field emitter materials.

Such an Al-including III nitride film is formed on a base made of sapphire single crystal or the like via a buffer layer made of III nitride and an underfilm made of Al-including nitride film as occasion demands. The buffer layer and the underfilm are made on the base in turn. Various functions are imparted to the III nitride film. Generally, the base, the buffer layer and the underfilm are regarded as an integrated substrate, which is called as a substrate for paraxial growth. Then, a single III nitride film or plural III nitride film are formed on the epitaxial growth substrate to fabricate a multilayered structure, which is called as an epitaxial growth substrate for semiconductor element.

The buffer layer is made at a low temperature within 500–700° C. under low crystallinity so as to compensate the difference in lattice constant between the base and the underfilm by means of CVD or MBE and so on.

Since the buffer layer is made at such a low temperature, however, the crystallinity of the buffer layer is not sufficient, so that the crystallinities of the underfilm and the III nitride film which are formed on the buffer layer can not be enhanced sufficiently. In addition, the buffer layer includes much dislocations, so that the underfilm and the III nitride film also includes much dislocations due to the dislocation propagation from the buffer layer, and the mosaic properties of the films which can be evaluated from their X-ray rocking curves are enlarged. Moreover, the crystal quality of the III nitride film such as dislocation density and crystallinity are fluctuated largely by the thermal hysteresis at the formation of the buffer layer and the III nitride film.

As a result, the crystal quality such as crystallinity and dislocation density of the III nitride film to which various function are imparted can not be enhanced sufficiently, so that the performance of a semiconductor element including the III nitride film may be deteriorated. For example, with a semi-conductor light-emitting element, the luminous efficiency may be deteriorated.

SUMMARY OF THE INVENTION

It is an object of the present invention to provide a new method for fabricating a III nitride film whereby a high crystal quality Al-including III nitride film can be formed on a given single crystal base, and to provide a new substrate for epitaxial growth whereby the high crystal quality Al-including III nitride film can be formed. It is also an object of the present invention to provide the high crystal quality Al-including III nitride film which is preferably usable for a semiconductor element.

Moreover, it is an object of the present invention to provide a semi-conductor element and an epitaxial growth substrate for semiconductor element which includes the above high crystal quality Al-including III nitride film.

In order to achieve the above object, this invention relates to a method for fabricating a III nitride film, comprising the steps of:

preparing a base made of single crystal, forming an acicular structure made of AlN on a main surface of the base, and forming an Al-including III nitride film on the main surface of the base via the acicular structure.

This invention also relates to a substrate for epitaxial growth comprising:

a base made of single crystal, and an acicular structure made of AlN and formed on a main surface of the base.

The inventors had intensely studied so as to form a high crystal quality Al-including III nitride film on a single crystal base. Then, the inventors focused attention on the condition of the main surface of the base on which the III nitride film is formed. As a result, if an acicular structure made of AlN is formed on the main surface of the base, and then, a given Al-including III nitride film is formed on the base via the acicular structure, without a buffer layer, the crystallinity of the III nitride film can be enhanced and the dislocation density of the III nitride film can be reduced.

In other words, with the fabricating method and the epitaxial growth substrate of the present invention, such a high crystal quality Al-including III nitride film can be fabricated. Concretely, the full width at half maximum (FWHM) at (002) reflection in X-ray rocking curve can be reduced to 100 seconds or below, and the FWHM at (102) reflection in X-ray rocking curve can be reduced to 2000 seconds or below, particularly 1500 seconds or below. Then, the dislocation density can be reduced $5\times10^{10}/cm^2$ or below, particularly $1\times10^{10}/cm^2$ or below.

In an additional III nitride film is formed on the above Al-including nitride film, the dislocation density of the additional III nitride film can be reduced to $1\times10^9/cm^2$ or below, particularly $1\times10^8/cm^2$ or below. The dislocation density reduction becomes conspicuous if the difference in Al content between the lower original III nitride film and the additional III nitride film is set to 0.5 or over, particularly 0.8 or over at mole ratio. Then, the dislocation density reduction becomes maximum if the additional III nitride film does not include Al element.

Accordingly, if the Al-including III nitride film such as above original III nitride film or the additional III nitride film is employed for a semiconductor element, the performance of the semiconductor element can be enhanced.

BRIEF DESCRIPTION OF THE DRAWINGS

For better understanding of the present invention, reference is made to the attached drawings, wherein.

DESCRIPTION OF THE PREFERRED EMBODIMENTS

Figure 1:
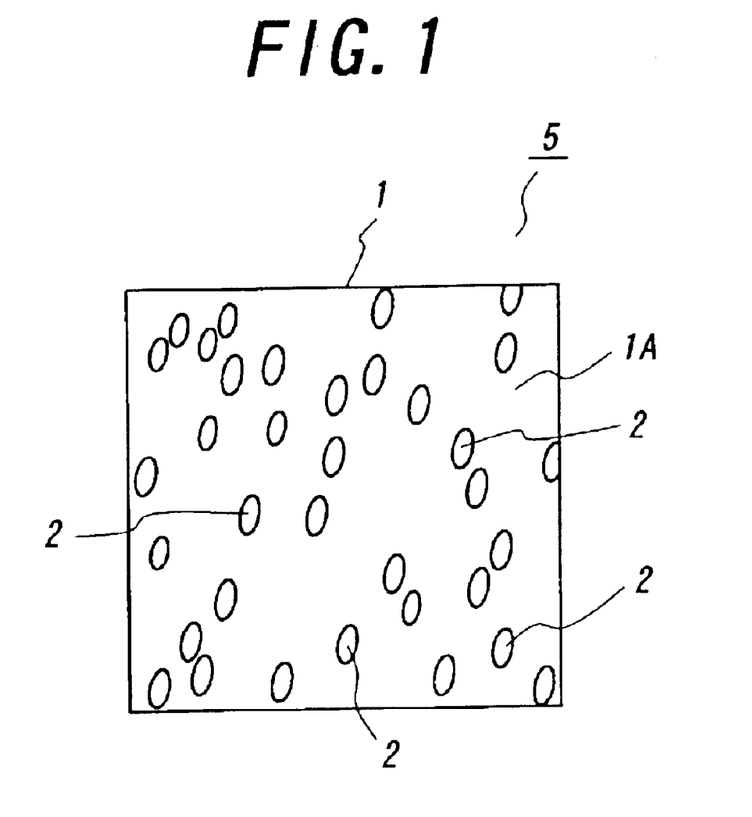
FIG. 1 is a plan view conceptually showing a part of a substrate for epitaxial growth according to the present invention.
Figure 2:
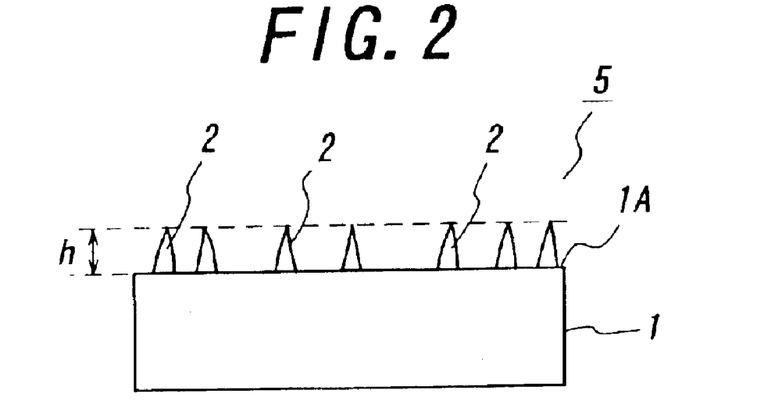
FIG. 2 is a cross sectional view conceptually showing a part of the epitaxial growth substrate of the present invention.

This invention will be described in detail, hereinafter. FIG. 1 is a plan view conceptually showing a part of a substrate for epitaxial growth according to the present invention, and FIG. 2 is a cross sectional view conceptually showing a part of the epitaxial growth substrate of the present invention. As illustrated in FIGS. 1 and 2, the epitaxial growth substrate 5 of the present invention includes the single crystal base 1 and the acicular structure 2 made of AlN formed on the main surface 1A of the base 1.

The height "h" of the acicular structure 2 is not restricted only if a high crystal quality Al-including III nitride film can be fabricated according to the present invention, but preferably set to 0.5 nm or over, particularly 1 nm or over. In this case, the crystal quality of the desired III nitride film can be enhanced, not dependent on the composition and the thickness of the III nitride film, and the forming condition for the III nitride film.

The upper limited value of the height "h" of the acicular structure 2 is not limited, but preferably set to 5 nm. If the height "h" of the acicular structure 2 is set beyond the upper limited value, the crystal quality of the desired III nitride film can not be almost enhanced. In addition, with the current forming technique, such a higher acicular structure can not be formed.

Similarly, the surface density of the acicular structure 2 is not restricted only if the high quality Al-including III nitride film as desired can be formed, but preferably set $1/\mu m^2$ or over, particularly $10/\mu m^2$ or over. In this case, the crystal quality of the III nitride film can be enhanced even though the III nitride film includes relatively much Al element.

The upper limited value of the surface density of the acicular structure 2 is not limited, but preferably set to $1000/\mu m^2$ at present. If the surface density of the acicular structure 2 is set beyond the upper limited value, the crystal quality of the III nitride film as desired can not be almost enhanced. In addition, with the current forming technique, such a high surface density acicular structure can not be formed.

The acicular structure 2 can be formed by a surface treatment for the base 1, for example. Concretely, the acicular structure 2 can be formed by setting and heating the base 1 in a reductive nitrogen-including atmosphere. Also, the acicular structure 2 can be formed by means of a surface treatment using a chloride-based gas or a fluorine-based gas. The surface treatment condition is selected appropriately on the sort of the base 1, and the height and the surface density of the acicular structure 2.

Moreover, the acicular structure 2 can be formed by means of a CVD method using an Al raw material gas such as trimetylaluminum (TMA) or triethylaluminum (TEA) and a nitrogen raw material gas such as ammonia ($NH_3$) gas. In this case, the CVD condition is controlled on the sort of the base 1, and the height and the surface density of the acicular structure 2.

In addition, the acicular structure 2 can be fabricated separatedly. In this case, the thus obtained acicular micro crystals are dispersed on the main surface 1A of the base 1.

The acicular structure 2 may contain B, In, Si, Ge, Be, Mg, Zn, H, C, O or the like. Moreover, the acicular structure 2 may contain inevitable minute element and minute impurities depending on the film-forming condition, the supply source, the base and the reactor material constituting the tubes, the reactor or the susceptor, in addition to the above-mentioned intentional elements.

The base 1 may be made of a single crystal oxide such as sapphire single crystal, ZnO single crystal, $LiAlO_2$ single crystal, $LiGaO_2$ single crystal, $MgAl_2O_4$ single crystal, or MgO single crystal, a IV single crystal or a IV—IV single crystal such as Si single crystal or SiC single crystal, a III-V single crystal such as GaAs single crystal, AlN single crystal, GaN single crystal or AlGaN single crystal, and a boride single crystal such as $ZrB_2$.

Moreover, the base 1 may include, on an underbase made of a single crystal as mentioned above, an epitaxial growth film which is made of a single crystal oxide such as ZnO single crystal or MgO single crystal, a IV single crystal or a IV—IV single crystal such as Si single crystal or SiC single crystal, a III-V single crystal such as GaAs single crystal or InP, or the mixture thereof.

In the present invention, a desired Al-including III nitride film is formed on the epitaxial growth substrate 5 as illustrated in FIGS. 1 and 2. Namely, the III nitride film is formed on the main surface 1A of the base 1 via the acicular structure 2. As a result, the crystallinity and the dislocation density of the III nitride film can be developed and thus, the III nitride film can have excellent crystal quality.

Concretely, in crystallinity, the FWHM at (102) reflection in X-ray rocking curve can be enhanced to 2000 seconds or below, particularly 1500 seconds or below while the FWHM at (002) reflection in X-ray rocking curve can be enhanced to 100 seconds or below. Also, the dislocation density can be reduced to $5 \times 10^{10}/cm^2$ or below, particularly $1 \times 10^{10}/cm^2$ or below.

The III nitride film can be formed by means of a CVD method. In this case, the epitaxial growth substrate 5 as illustrated in FIGS. 1 and 2 is set in a CVD reactor and heated to a predetermined temperature. Then, an Al raw material gas such as TMA or TEA and a nitrogen raw material gas such as $NH_3$ gas are introduced into the CVD reactor and supplied onto the epitaxial growth substrate 5.

In the case of incorporating another III element such as Ga element or In element except Al element, as a Ga raw material gas is employed trimetyl-gallium (TMG) and as an In raw material gas is employed trimethylindium (TMI). The raw material gas such as TMG or TMI is supplied onto the epitaxial growth substrate 5 with the Al raw material gas and the nitrogen raw material gas. These raw material gases are thermally and chemically reacted on the epitaxial growth substrate 5 to form the desired III nitride film on the substrate 5.

In the formation of the III nitride film using the CVD method, the epitaxial growth substrate 5 is preferably heated to 1100° C. or over, particularly 1150° C. or over. Thereby, the crystallinity of the III nitride film can be more enhanced. Herein, the above-mentioned temperature means a substrate surface temperature on which the III nitride film is formed.

Moreover, the upper limited beating temperature of the epitaxial growth substrate 5 is set to 1250° C. or below. If the epitaxial growth substrate 5 is heated beyond the upper limited value, the crystallinity of the III nitride film to be formed can not be almost enhanced. In addition, the surface of the III nitride film may be roughed, resulting in the deterioration of the crystal quality of the III nitride film.

The thickness of the Al-including III nitride film is preferably set to 0.5 μm or over, particularly within 1–3 μm. In this case, the crystallinity of the III nitride film can be more enhanced while the crack creation and the flaking from the epitaxial growth substrate of the III nitride film are prevented.

In the present invention, it is required that the III nitride film includes Al element. The Al content of the III nitride film is preferably set to at least 50 atomic percentages for all of the III elements therein. Particularly, it is desired that the III nitride film is made of AlN (100 atomic percentages of Al content). This invention is suitable for fabricating any kind of Al-including III nitride film, but the effect/function according to the present invention can be exhibited remarkably as the Al content of the III nitride film is increased.

The acicular structure 2 can not be observed apparently after the Al-including III nitride film is formed on the epitaxial growth substrate 5 via the acicular structure 2. The existence of the acicular structure 2, however, is surmised from the sharp boundary surface between the single crystal base 1 constituting the epitaxial growth substrate 5 and the III nitride film. It is important to form the acicular structure 2 so that the boundary surface between the base 1 and the III nitride film becomes sharp. In this case, dislocations, which is originated from the mismatch in lattice constant between the base 1 and the III nitride film, can be aligned in the boundary surface, so that the creation of dislocation can be repressed.

The III nitride film may contain another III element such as Ga element or In element except Al element. Then, the III nitride film may contain additional element such as Ge, Si, Mg, Zn, Be, P or B as occasion demands. Moreover, the III nitride film may contain inevitable minute element and minute impurities depending on the film-forming condition, the supply source and the reactor material.

Figure 3:
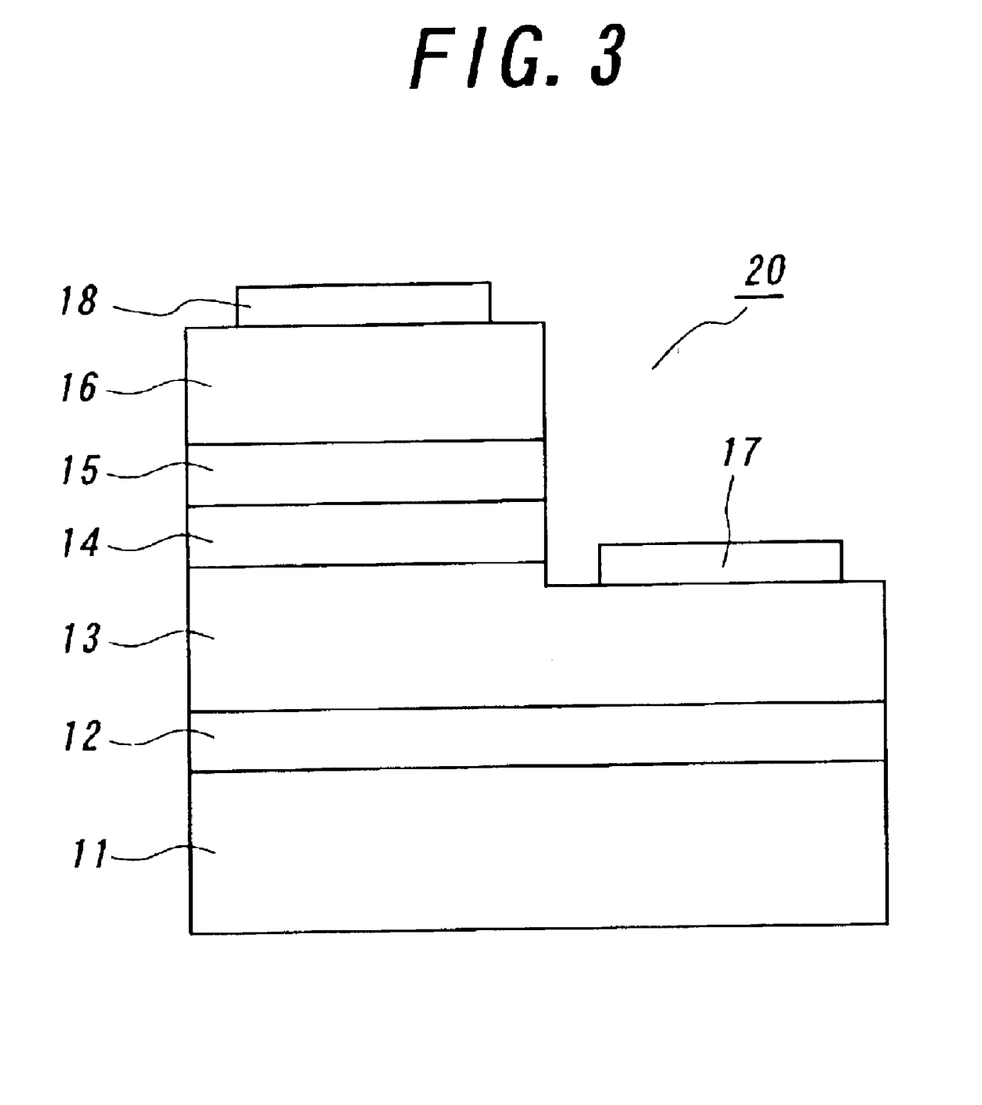
FIG. 3 is a structural view showing a semiconductor light-emitting element including the epitaxial growth substrate of the present invention.

FIG. 3 is a structural view showing a PIN-type semiconductor light-emitting element including an epitaxial growth substrate according to the present invention.

In the semiconductor light-emitting element 20 illustrated in FIG. 3, on the substrate 11 are formed in turn the underlayer 12, the n-type conductive layer 13, the light-emitting layer (active layer) 14, the p-type cladding layer 15 and the p-type conductive layer 16. The n-type conductive layer 13 is partially removed, and then, the main surface of the layer 13 is partially exposed. The n-type electrode 17 made of Al/Ti, etc. is formed on the exposed main surface of the layer 13, and the p-type electrode 18 made of Au/Ni, etc. is formed on the p-type conductive layer 16.

When a given voltage is applied between the n-type electrode 17 and the p-type electrode 18, the recombination of carriers is created to generate and emit a given light. The wavelength of the emitted light is determined on the structure and the composition of the light-emitting layer 14.

In the semiconductor light-emitting element 20 illustrated in FIG. 3, the substrate 11 is made of an epitaxial growth substrate as shown in FIGS. 1 and 2 according to the present invention. The underlayer 12 is made of an Al-including III nitride film as mentioned above. Therefore, the underlayer 12 must satisfy the above-mentioned requirements for the III nitride film.

The Al contents of the n-type conductive layer 13 through the p-type conductive layer 16 which are formed on the underlayer 12 are preferably set larger than the Al content of the underlayer 12 by 0.5 or over, particularly 0.8 or over at mole ratio. In this case, the dislocation densities of the n-type conductive layer 13 through the p-type conductive layer 16 can be reduced effectively. More preferably, the n-type conductive layer 13 through the p-type conductive layer 16 are made of III nitrides not including Al element. In this case, the dislocation density reduction becomes more conspicuous.

In the semiconductor light-emitting element 20 illustrated in FIG. 3, since the substrate 11 is made of an epitaxial growth substrate according to the present invention and the underlayer 12 is made of a high crystal quality Al-including III nitride film fabricated according to the present invention, the crystal qualities of the n-type conductive layer 13 through the p-type conductive layer 16 can be developed, so that the semiconductor light-emitting element 20 can exhibit a high luminous efficiency.

The underlayer 12 through the p-type conductive layer 16 can be fabricated through epitaxial growth by means of a MOCVD method, for example.

EXAMPLES

This invention will be concretely described hereinafter.

Examples 1–3

A c-faced sapphire single crystal was employed as a base, and then, set and attracted on a susceptor installed in a reactor. Thereafter, the base was heated to 1150° C. and held for ten minutes with flowing a hydrogen gas at a total amount of 10 slm, thereby to clean the main surface of the base. Then, an NH$_3$ gas was introduced into the reactor and supplied onto the base at a flow rate of 1000 sccm, a total amount of 5 slm and a pressure of 20 Torr for 0.5 minutes, three minutes and five minutes, respectively, to perform three different surface treatments for the main surface of the base.

Figure 4:
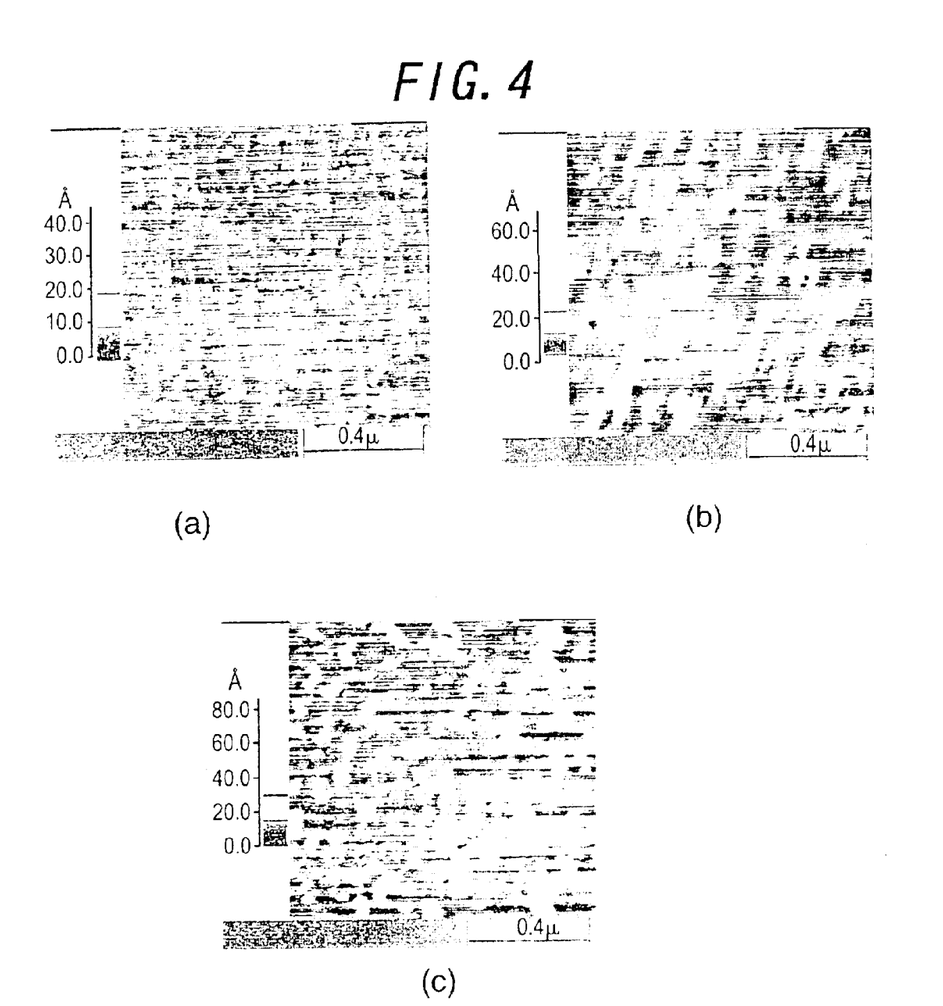
FIG. 4 is AFM images showing the condition of the main surface of the epitaxial growth substrate of the present invention.
Figure 5:
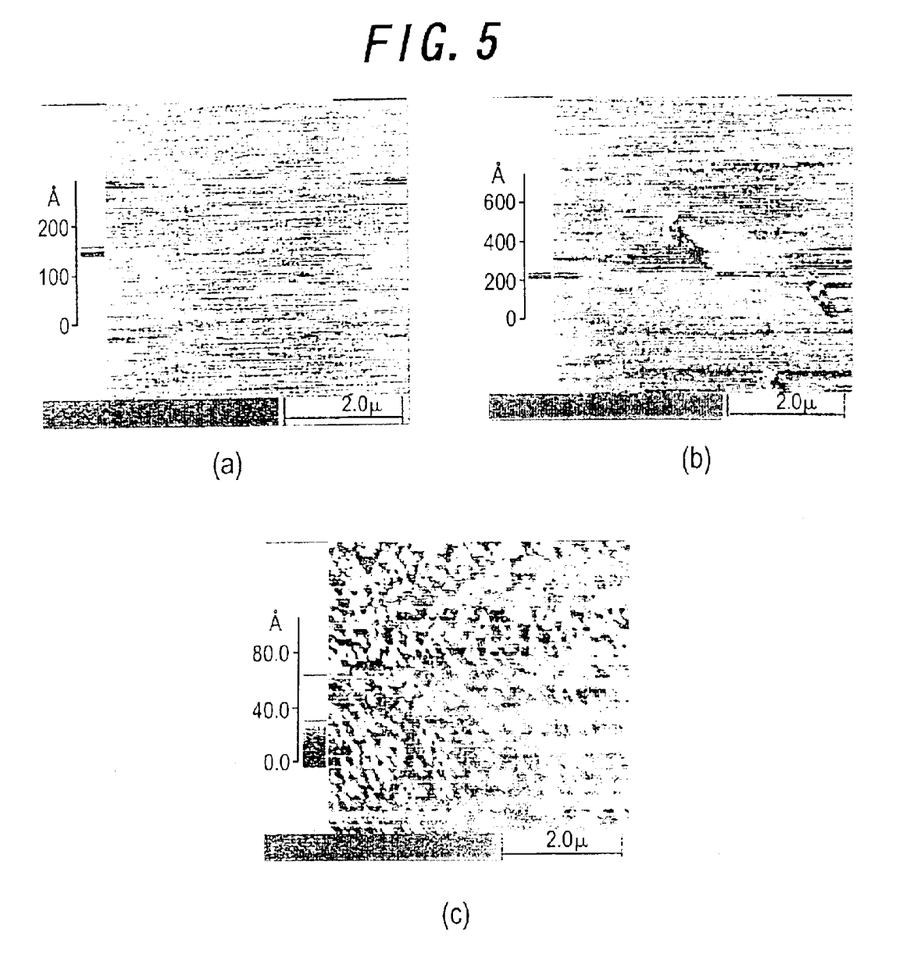
FIG. 5 is other AFM images showing the condition of the main surface of the present invention.

FIGS. 4 and 5 are AFM images showing the surface conditions of the main surface of the base as the three different surface treatments are performed. FIG. 4 shows AFM images within 1 μm square region, and FIG. 5 shown AFM images within 5 μm square region. FIG. 4(a) and FIG. 5(a) correspond to AFM images at the surface treatment for 0.5 minutes, and FIG. 4(b) and FIG. 5(b) correspond to AFM images at the surface treatment for three minutes. FIG. 4(c) and FIG. 5(c) correspond to AFM images at the surface treatment for five minutes. Herein, white spots correspond to acicular structure.

As is apparent from FIGS. 4 and 5, acicular structures are formed on the main surface of the base by the above-mentioned surface treatments. Then, the surface density of the acicular structures is increased with the period of the surface treatment.

Then, a TMA and an NH$_3$ were introduced at a total amount of 10 slm, a pressure of 15 Torr and a flow rate ratio (NH$_3$/TMA)=500, to form an AlN film in a thickness of 2 μm on the base via the acicular structure. Then, the crystallinity of the AlN film is examined, and listed in Table 1.

Figure 6:
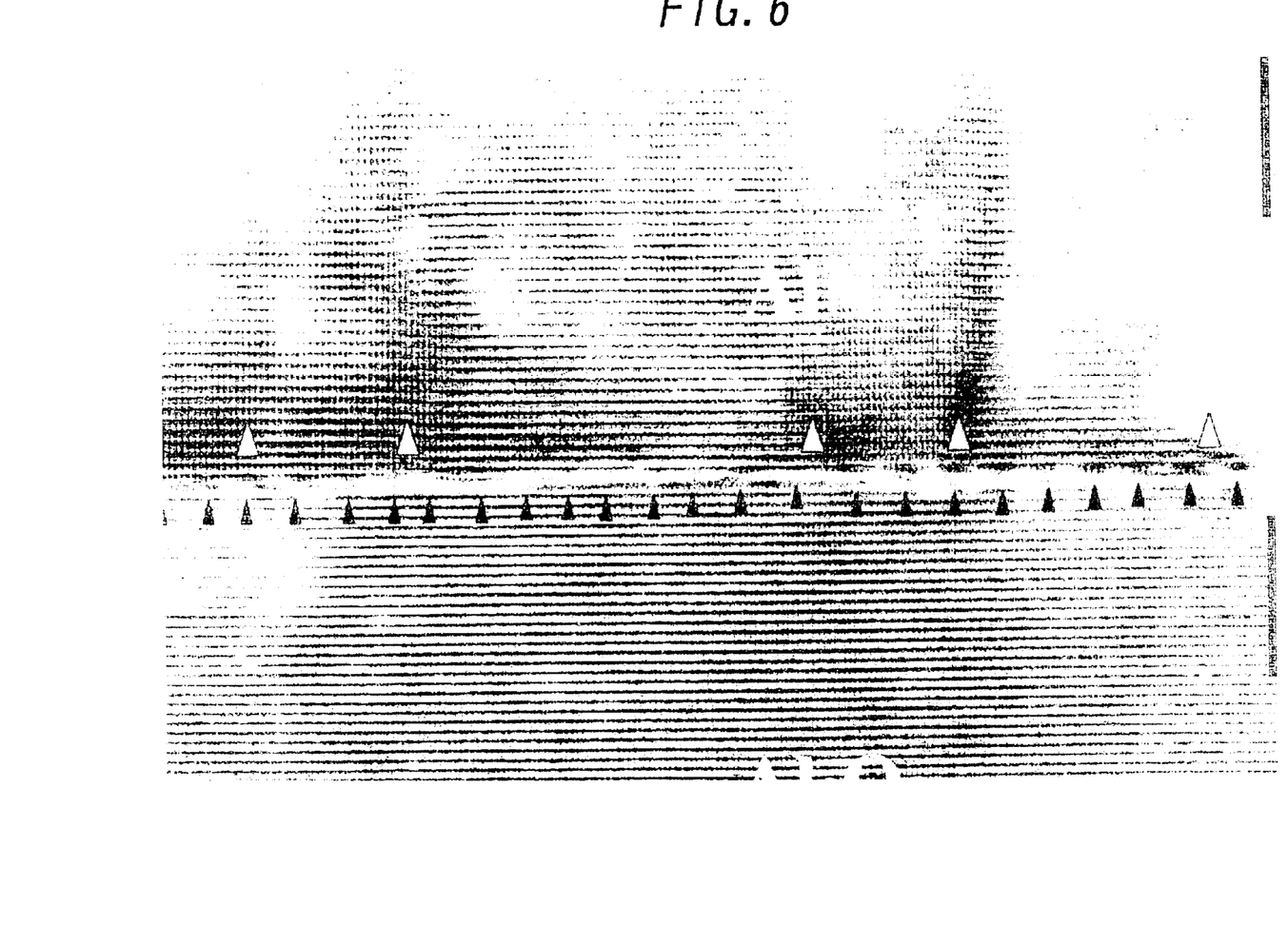
FIG. 6 is a cross sectional TEM image of the epitaxial growth substrate of the present invention.

The cross section of the resulting multilayered structure was observed by mean of TEM, in order to observe the atomic image for the boundary surface between the AlN film and the base. It was turned out from the TEM observation that boundary surface roughness was reduced to three atomic steps or below within 100 nm region, and thus, the boundary surface was sharp. Dislocations originated from lattice mismatch were observed at nearly equal space of every seven or eight atomic layers of the AlN layer. FIG. 6 shows the cross sectional TEM image.

Then, the temperature of the base was set to 1120° C., and a TMA, an $NH_3$ and a $SiH_4$ were flowed at a total gas average flow rate of 1 m/sec under a normal pressure, to form a Si-doped n-$Al_{0.05}Ga_{0.95}N$ layer in a thickness of 3 μm as an n-type conductive layer. The film forming rate was set to 3 μm/hr by controlling the supply amount of the raw material gases. The $SiH_4$ was supplied so that the carrier density of the n-$Al_{0.05}Ga_{0.95}N$ layer was set to $5 \times 10^{17}/cm^3$.

Then, the supply of the above raw material gases was stopped, and a nitrogen carrier gas was flowed instead of the above hydrogen carrier gas. The temperature of the base was set to 700° C. Then, a TMI, a TMG and an $NH_3$ were supplied onto the n-$Al_{0.05}Ga_{0.95}N$ layer at a total gas flow rate of 1 m/sec, to form a MQW structured light-emitting layer made of i-GaN layer. Then, a TMA was switched for the TMI, and a $Cp_2Mg$ was supplied, to form a p-$Al_{0.15}Ga_{0.85}N$ layer in a thickness of 20 nm as a p-type cladding layer. The carrier density of the p-$Al_{0.15}Ga_{0.85}N$ layer was set to $2 \times 10^{17}/cm^3$ by controlling the flow rate of the $Cp_2Mg$. Thereafter, the supply of the TMA was stopped, and the base was heated to 1100° C. Then, a TMG, an $NH_3$ and $Cp_2Mg$ were supplied onto the p-$Al_{0.15}Ga_{0.85}N$ layer, to form a Mg-doped $Al_{0.05}Ga_{0.95}N$ layer in a thickness of 0.2 μm.

The dislocation densities of the n-AlGaN layer, the i-GaN layer and the p-AlGaN, which correspond to additional III nitride films formed on the inherent III nitride film, AlN layer, were examined through cross section TEM observation, and listed in Table 1.

Comparative Example

Without a surface treatment using an $NH_3$, an AlN film was formed directly on the base made of sapphire single crystal. The crystallinity of the AlN film was examined and listed in Table 1. In some cases, there were observed peak splits at (102) reflection in X-ray diffraction.

Figure 7:
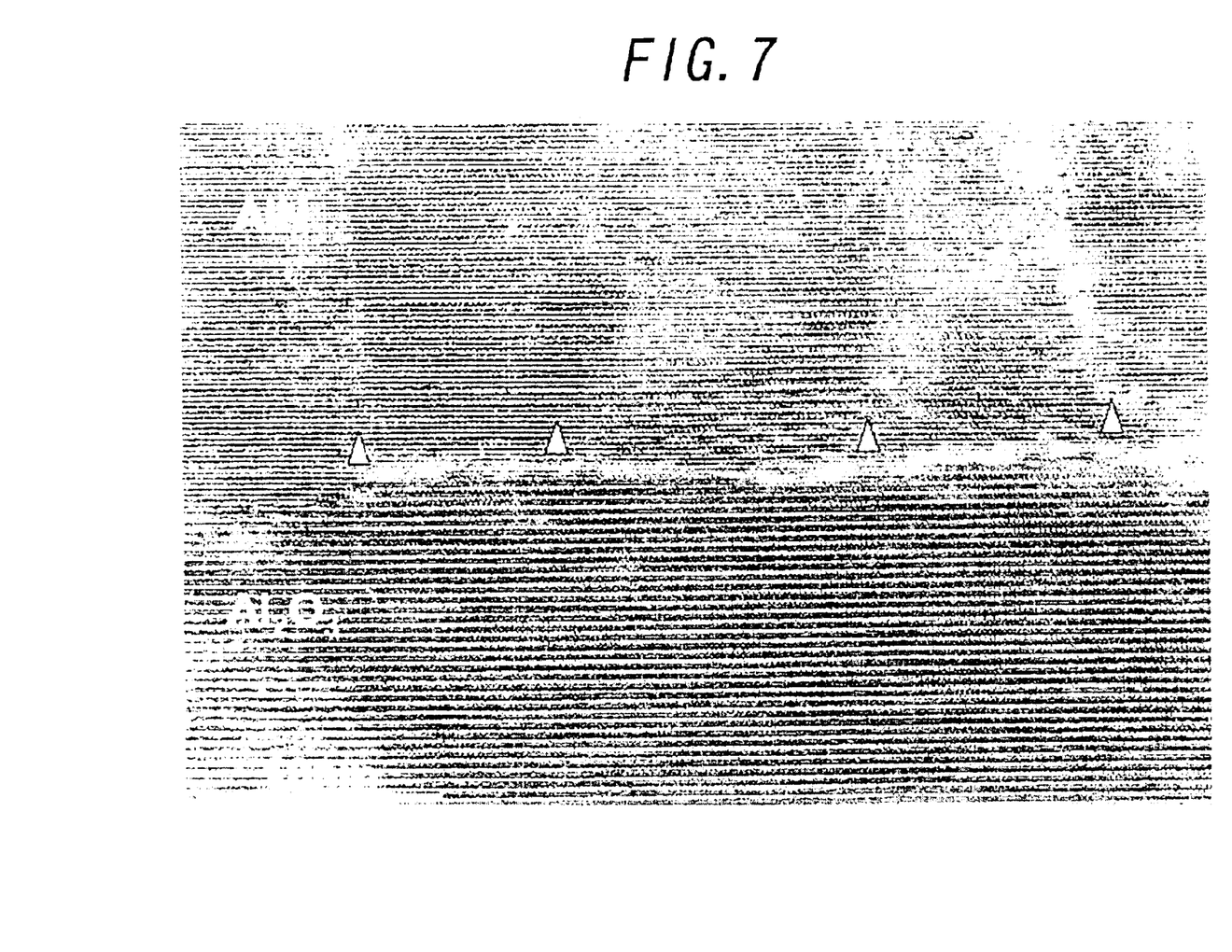
FIG. 7 is a cross sectional TEM image of a conventional epitaxial growth substrate.

The atomic image of the boundary surface between the AlN film and 5 the base was observed by means of cross section TEM observation. It was turned out from the TEM observation that the boundary surface roughness was increased to five atomic steps within 100 nm region, and thus, the boundary surface was roughed. No dislocations originated from the lattice mismatch were observed apparently. FIG. 7 shows the cross sectional TEM image.

reduced, as being compared with the AlN film formed not via the acicular structure. Also, the crystallinity of the AlN film formed via the acicular structure is enhanced, as being compared with the AlN film not via the acicular structure. Concretely, the FWHM at (102) reflection in X-ray rocking curve is developed to 100 seconds or below while the FWHM at (002) reflection in X-ray rocking curve is developed to 2000 seconds or below.

Moreover, all of the dislocation densities of the additional III nitride films such as the n-AlGaN layer and the like are reduced.

Although the present invention was described in detail with reference to the above examples, this invention is not limited to the above disclosure and every kind of variation and modification may be made without departing from the scope of the present invention. For example, a buffer layer or a multi-layered structure such as a distorted superstructure may be provided on the base. In this case, the crystallinity of the Al-including III nitride film to be formed can be developed.

As mentioned above, according to the present invention, a new method for fabricating a III nitride film whereby a high crystal quality Al-including III nitride film can be formed on a given single crystal base can be provided. And a new substrate for epitaxial growth whereby the high crystal quality Al-including III nitride film can be formed can be provided. Moreover, the high crystal quality Al-including III nitride film which is preferably usable for a semiconductor element can be provided.

What is claimed is:

1. A method for fabricating a III nitride film, comprising the steps of:
   preparing a base made of single crystal,
   forming an acicular structure made of AlN on a main surface of said base, and
   forming an Al-including III nitride film on said main surface of said base via said acicular structure.

2. The fabricating method as defined in claim 1, wherein the height of said acicular structure is set to 0.5 nm or over.

3. The fabricating method as defined in claim 1, wherein the surface density of acicular portion in said acicular structure is set to $1/\mu m^2$ or over.

4. The fabricating method as defined in claim 1, wherein the Al content of said III nitride film is set to at least 50 atomic percentages for all of the III elements thereof.

5. The fabricating method as defined in claim 4, wherein said III nitride film is made of AlN.

6. The fabricating method as defined in claim 1, wherein said III nitride film is formed at 1100° C. or over by means of a CVD method.

TABLE 1

|  | Acicular structure | Height of acicular structure (nm) | Surface density of acicular structure (/cm³) | FWHM at (002) reflection (seconds) | FWHM at (102) reflection (seconds) | Dislocation density of additional III nitride film (/cm³) |
|---|---|---|---|---|---|---|
| Example 1 | presence | 1.2 | 35 | 50 | 1800 | $3 \times 10^8$ |
| Example 2 | presence | 2.0 | 40 | 60 | 1400 | $1 \times 10^8$ |
| Example 3 | presence | 3.5 | 80 | 80 | 900 | $5 \times 10^7$ |
| Comparative Example | absence | — | — | 80 | 2500 | $1 \times 10^{10}$ |

As is apparent from Table 1, the dislocation density of the AlN film formed on the base via the acicular structure is 7. The fabricating method as defined in claim 6, wherein said III nitride film is formed within 1100–1250° C.

8. The fabricating method as defined in claim 1, wherein the full width at half maximum (FWHM) at (002) reflection is 100 seconds or below, and the full width at half maximum (FWHM) at (102) reflection is 2000 seconds or below.

9. A substrate for epitaxial growth comprising:

a base made of single crystal, and an acicular structure made of AlN and formed on a main surface of said base.

10. The epitaxial growth substrate as defined in claim 9, wherein the height of said acicular structure is set to 0.5 nm or over.

11. The epitaxial growth substrate as defined in claim 9, wherein the surface density of acicular portion in said acicular structure is set to $1/\mu m^2$ or over.

12. A III nitride film comprising a full width at half maximum (FWHM) at (002) reflection of 100 seconds or below and a full width at half maximum (FWHM) at (102) reflection of 2000 seconds or below.

13. The III nitride film as defined in claim 12, comprising an Al content of at least 50 atomic percentages for all of the III elements thereof.

14. The III nitride film as defined in claim 13, which is made of AlN.

15. An epitaxial substrate for III nitride element comprising a III nitride film as defined in claim 12.

16. A III nitride element comprising a III nitride film as defined in claim 12.

* * * * *